US006730423B2

(12) United States Patent
Einhart et al.

(10) Patent No.: US 6,730,423 B2
(45) Date of Patent: May 4, 2004

(54) ELECTRICAL CONTACTING DEVICE FOR AN ELECTROCHEMICAL FUEL CELL

(75) Inventors: Johann Einhart, Uhldingeu-Munholer (DE); Christian Cremer, Nabern (DE)

(73) Assignee: Ballard Power Systems Inc., Burnaby (CA)

( * ) Notice: Subject to any disclaimer, the term of this patent is extended or adjusted under 35 U.S.C. 154(b) by 49 days.

(21) Appl. No.: 10/068,263

(22) Filed: Feb. 5, 2002

(65) Prior Publication Data

US 2002/0090540 A1 Jul. 11, 2002

Related U.S. Application Data

(63) Continuation of application No. 09/436,517, filed on Nov. 9, 1999, now abandoned.
(60) Provisional application No. 60/107,608, filed on Nov. 9, 1998.

(51) Int. Cl.[7] .............................. H01M 8/24; H01M 2/22
(52) U.S. Cl. .............................. 429/12; 429/34; 429/32
(58) Field of Search ...................................... 429/12–39

(56) References Cited

U.S. PATENT DOCUMENTS

| | | | |
|---|---|---|---|
| 4,921,748 A | 5/1990 | Bohrn et al. | 428/209 |
| 5,096,788 A | 3/1992 | Bresin et al. | 429/99 |
| 5,147,985 A | 9/1992 | DuBrucq | 174/260 |
| 5,354,625 A | * 10/1994 | Bentz et al. | 429/17 |
| 5,472,804 A | 12/1995 | Austin et al. | 429/99 |
| 5,565,280 A | 10/1996 | Difrancesco | 429/34 |
| 5,585,162 A | 12/1996 | Schueller | 428/131 |
| 5,691,041 A | 11/1997 | Frankeny et al. | 428/209 |
| 6,042,933 A | 3/2000 | Hirai et al. | 428/209 |
| 6,108,903 A | 8/2000 | Nakatani et al. | 29/852 |
| 6,127,058 A | * 10/2000 | Pratt et al. | 429/30 |
| 6,174,606 B1 | 1/2001 | Brusic et al. | 428/413 |
| 6,207,259 B1 | 3/2001 | Iino et al. | 428/209 |
| 6,410,176 B1 | * 6/2002 | Genc et al. | 429/13 |

FOREIGN PATENT DOCUMENTS

| | | | |
|---|---|---|---|
| JP | 60-101881 | 6/1985 | H01M/8/18 |
| WO | WO 99/66339 | 12/1999 | G01R/31/36 |
| WO | WO 99/67654 | 12/1999 | G01R/31/36 |
| WO | WO 99/67869 | 12/1999 | H02J/7/00 |
| WO | WO 00/02270 | 1/2000 | H01M/8/10 |

OTHER PUBLICATIONS

Cleghorn, et al., "A Printed circuit Board Approach to Measuring Current Distribution in a Fuel Cell," *Journal of Applied Electrochemistry*, 28(1998):663–672 (Nov. 3, 1997).

* cited by examiner

*Primary Examiner*—Stephen Kalafut
(74) *Attorney, Agent, or Firm*—McAndrews, Held & Malloy, Ltd.

(57) ABSTRACT

An electrical contacting device for a fuel cell assembly comprises a printed circuit board comprising electrically conductive regions for providing reliable electrical contact with fuel cell components of the fuel cell assembly. Preferably the printed circuit board is flexible. The contacting device may be used, for example, for monitoring cell operating parameters like current or voltage, for short circuiting or by-passing individual cells or for directing signals to the stack.

21 Claims, 7 Drawing Sheets

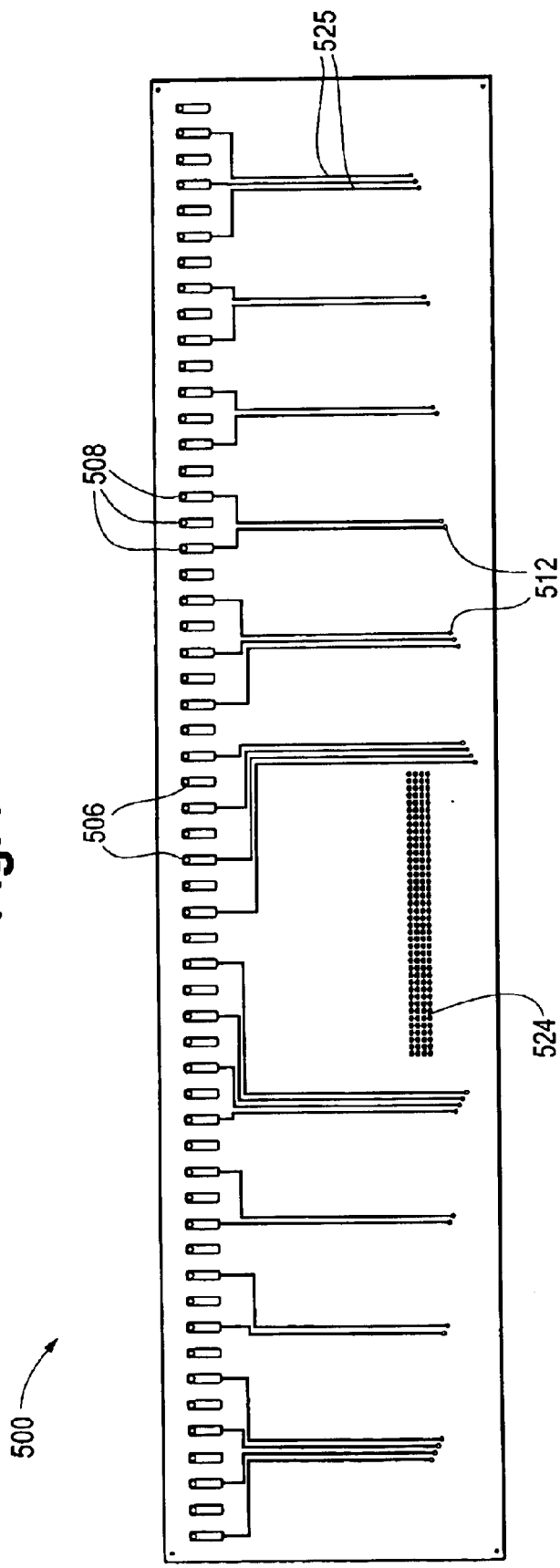

ELECTRICAL CONTACTING DEVICE FOR AN ELECTROCHEMICAL FUEL CELL

CROSS-REFERENCE TO RELATED APPLICATION

This application is related to and claims priority benefits from U.S. Provisional Patent Application Ser. No. 60/107,608 filed Nov. 9, 1998, entitled "Electrical Contacting Device For An Electrochemical Fuel Cell". The '608 provisional application, incorporated herein by reference in its entirety, describes an electrical contacting device comprising a printed circuit board having electrically conductive regions for providing reliable electrical contact with fuel cell components of a solid polymer fuel cell stack. This application is a continuation of U.S. patent application Ser. No. 09/436,517, filed Nov. 9, 1999, now abandoned, entitled "Electrical Contacting Device for an Electrochemical Fuel Cell." The '517 application is incorporated herein by reference in its entirety.

FIELD OF THE INVENTION

The present invention relates to an electrochemical fuel cell assembly. More particularly, the present invention relates to an electrical contacting device for a solid polymer fuel cell stack.

BACKGROUND OF THE INVENTION

Electrochemical fuel cells convert fuel and oxidant to electricity and reaction product. Solid polymer electrochemical fuel cells generally employ a membrane electrode assembly ("MEA") consisting of a solid polymer electrolyte or ion exchange membrane disposed between two electrode layers.

In typical fuel cells, the MEA is disposed between two electrically conductive separator or fluid flow field plates. Fluid flow field plates have at least one flow passage formed therein to direct the fuel and oxidant to the respective electrode layers, namely, the anode on the fuel side and the cathode on the oxidant side. In a single cell arrangement, fluid flow field plates are provided on each of the anode and cathode sides. The plates act as current collectors and provide support for the electrodes.

Two or more fuel cells can be connected together, generally in series but sometimes in parallel, to increase the overall power output of the assembly. In series arrangements, one side of a given plate may serve as an anode plate for one cell and the other side of the plate can serve as the cathode plate for the adjacent cell. Such a series connected multiple fuel cell arrangement is referred to as a fuel cell stack, and is typically held together in its assembled state by tie rods and end plates. A compression mechanism is generally required to ensure sealing around internal stack manifolds and flow fields, and also to ensure adequate electrical contact between the surfaces of the plates and membrane electrode assemblies to provide the serial electrical connection among the fuel cells which make up the stack.

In most fuel cell assemblies, current is drawn from the fuel cell stack via a pair of bus plates, one of which is positioned at each end of the fuel cell stack. The fuel cells are stacked between the bus plates, which are typically formed of copper or coated copper. Very often, individual cells of the stack are contacted for monitoring individual cell voltages or currents, and/or for control or charging/discharging purposes. In most cases, these electrical contacts are not intended to carry the entire stack current, but are to be capable of providing electrical connection to individual fuel cells or groups of cells.

In mass production, an electrical contacting device is needed which is easy to handle and to install, and which provides reliable electrical contact with certain components of a fuel cell stack. It may be desirable to provide, in a single device, groups of contacts that always communicate with the same type of fuel cell component within the stack, or that contact the fuel cell stack at regularly spaced intervals along the length of the stack. In general, it is preferred that most components of the fuel cell stack be electrically isolated from the surrounding environment, and not readily electrically accessible from the outside because of potential electrical shock hazards. For this reason, fuel cell stacks often have some form of electrically insulating cover or housing.

In operation, fuel cells expand and contract due to thermal variations, internal pressure changes and gradual compression of cell components over time. Thus, in a fuel cell stack where a plurality of cells is stacked and electrically connected in series, the overall stack length may vary significantly over time. Preferably, a contacting device can accommodate such dimensional changes. For example, the contacting device may be designed to have a similar thermal expansion coefficient to components of the particular fuel cell stack.

Furthermore, depending on the application, a fuel cell stack may be subject to vibration. In these situations, the contacting device will be effective if reliable electrical contact is maintained when the fuel cell is subject to vibration.

An operational fuel cell stack may generate high electrical currents. The changing electrical current may induce electromagnetic fields around the stack. Signals transmitted by the contacting device are often low both in voltage and current. Thus, unless appropriate precautions are taken, the contacting device may be subject to electromagnetic interference caused by the fuel cell stack itself and also other system components which may be present, such as electric motors and power conditioning devices.

Space is often at a premium in fuel cell systems, especially, for example, in automotive and portable applications. A contacting device for a fuel cell stack with a thin profile (that is, a sheet or board) may be easier to accommodate than a more bulky contacting device having significant thickness in all three dimensions. The contacting device may also have to withstand the operating fuel cell environment which may be, for example, a moist and/or an acidic or alkaline environment.

Thus, there is a need for a fuel cell contacting device that satisfies some, or preferably all, of the above requirements.

SUMMARY OF THE INVENTION

An electrical contacting device for a fuel cell assembly comprises a circuit board having electrically conductive regions for electrically contacting fuel cell components of the fuel cell assembly. The circuit board is preferably a printed circuit board that is flexible, rather then being substantially rigid. Typically, the circuit board comprises at least two layers, with one of the layers being an electrically insulating carrier layer upon which one or more other layers, such as electronic circuits, are disposed. Openings formed within the carrier layer may enhance the flexibility of the circuit board. The electrically conductive regions and associated electrically conductive paths are usually formed in a layer disposed upon at least one planar surface of the carrier layer. In some embodiments, electrically conductive paths are each connected to a different electrically conductive region, and the electrically conductive paths are formed in a plurality of the circuit board layers, which are preferably two layers that are associated with opposite planar surfaces of the carrier layer. An electromagnetic shielding layer may be incorporated into the multilayer circuit board.

The surfaces of the electrically conductive regions of the circuit board may be rough or uneven (that is, having projections extending from and recesses extending into the surface thereof), or may include anchors, such as, for example, pins, studs, pegs, or other attachment means, to improve or facilitate their electrical contact with the fuel cell components. The electrically conductive regions may be covered or coated with an electrically conductive film with lower material resistance than the material resistance of the underlying material. The film is preferably corrosion resistant.

An improved fuel cell assembly comprises a fuel cell stack with an electrical contacting device mounted on a face of the stack. The tow electrical contacting device preferably comprises a flexible printed circuit board with electrically conductive regions that are in electrical contact with fuel cell components of individual cells or groups of cells of the stack.

The circuit board may be fastened to the stack using any type of fastener, for example, screws, bolts, pins, pegs, clips, clamps or rivets. In addition, or alternatively, the fuel cell assembly may comprise a compression device for urging the circuit board against the face of the stack. In other embodiments, the circuit board may be in interlocking engagement with components of the stack, or may be bonded to the stack. In yet another embodiment, the circuit board may be utilized as a diagnostic tool that is attached to the stack only when it is being repaired or during regular service checks.

Preferably, the thermal expansion factors of the circuit board and the fuel cell stack are similar, and most preferably substantially identical.

BRIEF DESCRIPTION OF THE DRAWINGS

FIG. 6 is the same plan view of the circuit board of FIG. 5, wherein FIG. 6 shows only the electrical conduits on the top planar surface of the carrier layer.

FIG. 7 is the same plan view of the circuit board of FIG. 5, wherein FIG. 7 shows only the electrical conduits on the bottom planar surface of the carrier layer.

DETAILED DESCRIPTION OF PREFERRED EMBODIMENTS

Figure 1:
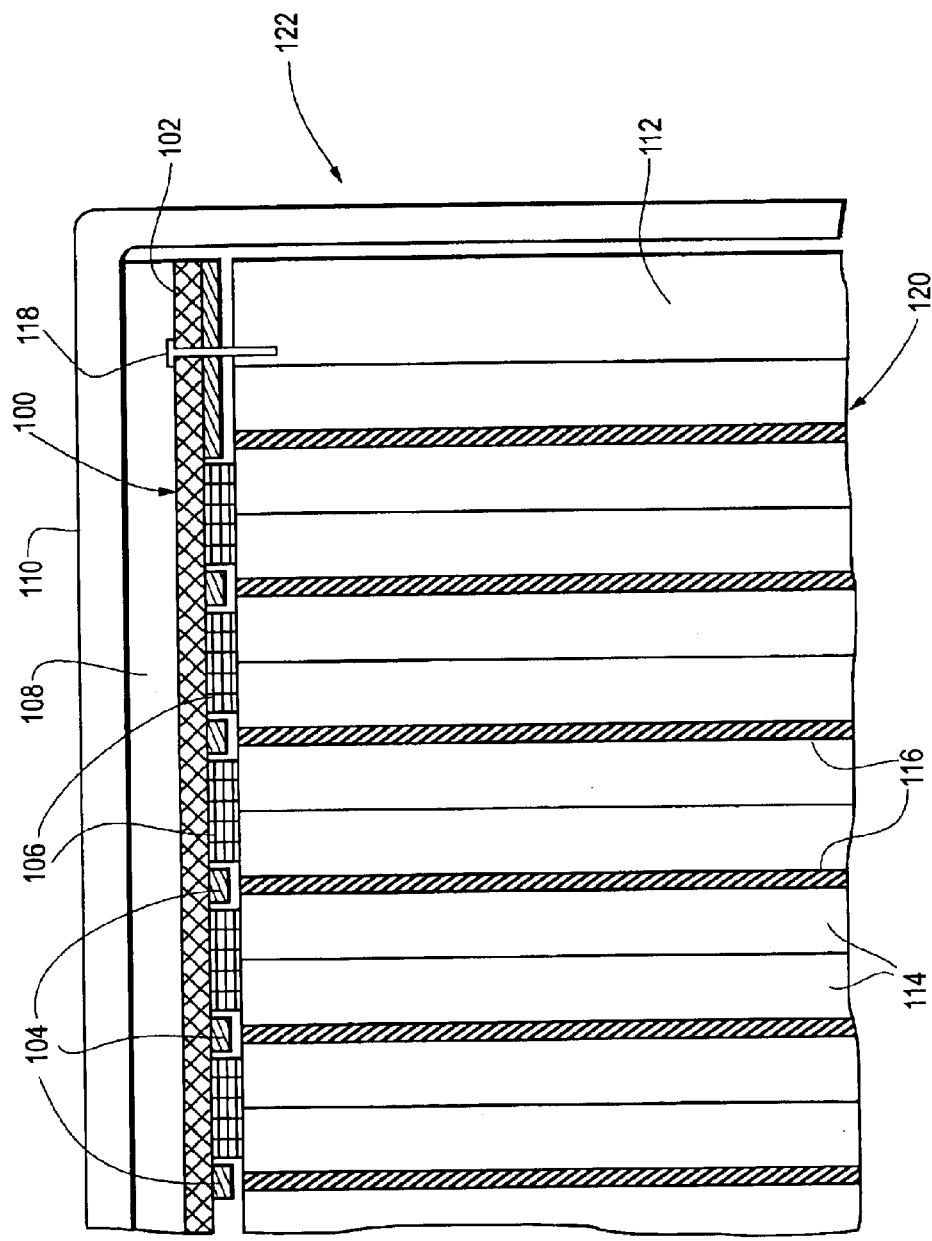
FIG. 1 is a schematic sectional view of a first embodiment of a fuel cell assembly incorporating an electrical contacting device.

FIG. 1 is a schematic sectional view of a fuel cell assembly 122 comprising an electrical contacting device 100. A plurality of solid polymer fuel cells, each comprising a membrane electrode assembly 116 interposed between a pair of separator or reactant distribution (flow field) plates 114, make up an illustrated portion of fuel cell stack 120. A current collector or bus plate 112 is positioned at one end of stack 120 (another bus plate is at the other end, not shown). The bus plate 112 is often fabricated out of a metal. Alternatively, bus plate 112 may be fabricated from a current conducting composite resin. Preferably the bus plate incorporates one or more fasteners 118 for securing contacting device 100 to one face of stack 120. Fasteners 118 may be, for example, rods, pins, studs, screws, clips, pegs or bolts. In the illustrated embodiment, contacting device 100 comprises a carrier layer or support sheet 102 and a plurality of electrically conductive regions 106. Carrier layer 102 bears two kinds of layers on one face thereof. Layers 106 are electrically conductive. Layers 104 are made of an electrically insulating material, and separate the electrically conductive layers 106. A preferable material for the conductive layers is a metal. In the embodiment of FIG. 1 insulating layers 104 are compressible and resilient. Electrically conducting layers 106 are each in physical and electrical contact with the edge of an electrically conductive separator plate 114. On the other side of carrier layer 102 is a resilient cushion 108. This can co-operate with a case or housing 110 disposed around the complete fuel cell assembly, to urge contacting device 100 against fuel cell stack 120. In the event the fuel cell generates high currents, additional layers (not shown) on one or both sides of the carrier layer 102 can serve as electromagnetic shields.

Figure 2:
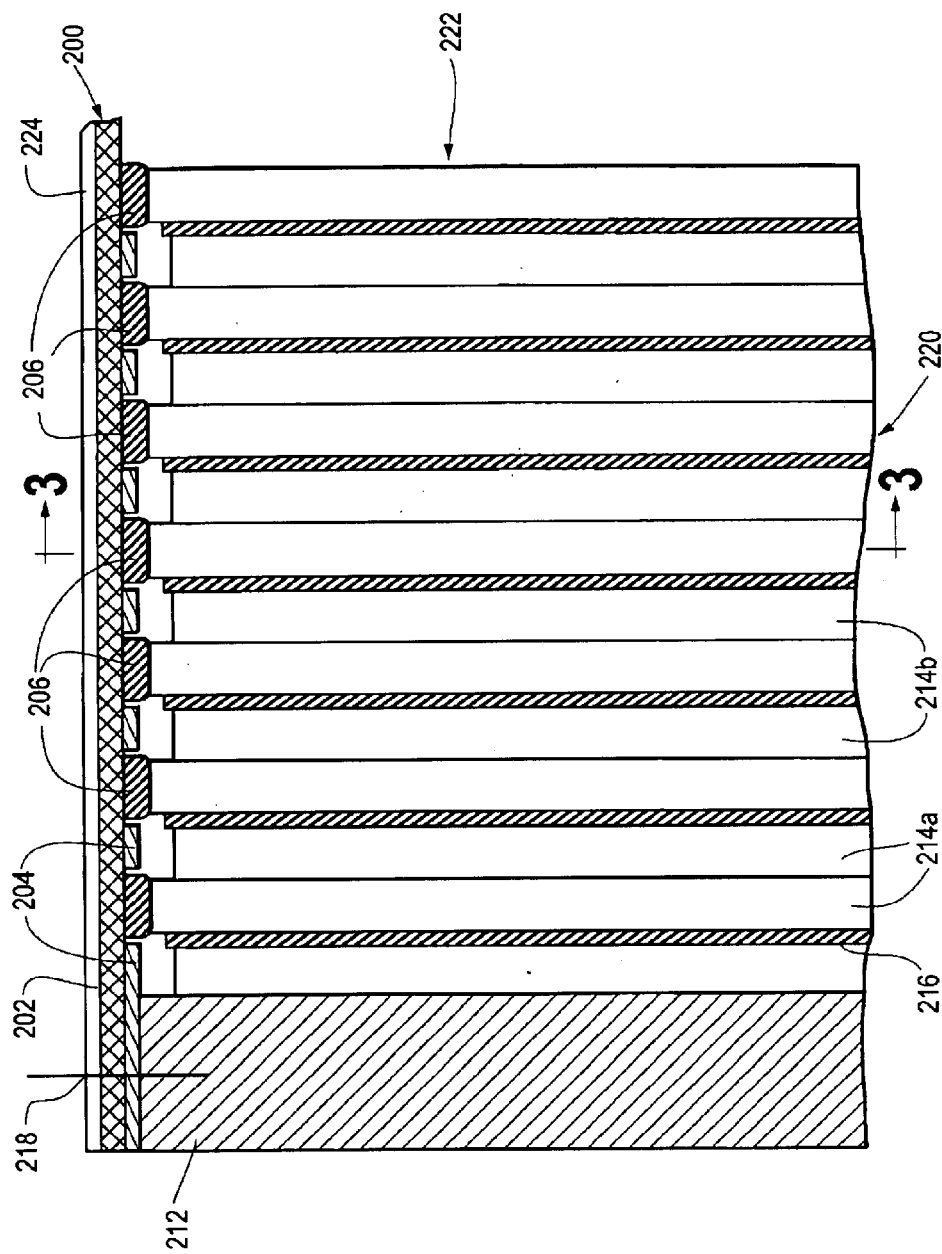
FIG. 2 is a schematic sectional view of a second embodiment of a fuel cell assembly incorporating an electrical contacting device.

In FIG. 2, a fuel cell assembly 222 similar to that of FIG. 1 is illustrated. Assembly 222 comprises electrical contacting device 200, and a solid polymer fuel cell stack, comprising a plurality of solid polymer fuel cells. A portion 220 of the stack is shown, with each cell comprising a membrane electrode assembly 216 interposed between a pair of separator or reactant distribution (flow field) plates 214a and 214b. Bus plate 212 with one or more fasteners 218, is positioned at one end of stack 220. Again, contacting device 200 comprises a carrier layer 202, a plurality of electrically conductive regions 206 and a plurality of electrically insulating layers 204 separating electrically conductive layers 206.

In the schematic of FIG. 2, a housing around the fuel cell assembly is omitted. Carrier layer 202 is of a sufficient thickness and strength to withstand impacts and protect the fuel cell stack 220. In this embodiment, fuel cell stack 220 includes different types of separator plates, 214a and 214b. One distribution plate (214a) of every pair protrudes relative to the remaining plates (214b) and membrane electrode assemblies 216. Protruding plates 214a are in electrical contact with electrically conductive regions 206 of contacting device 200. In an alternative embodiment (not shown) the contacted plates are recessed relative to the rest of the face of the stack 220, and electrically conductive portions of the contacting device protrude to contact these recessed plate edges. In FIG. 2 an additional electromagnetic shielding layer 224 covers carrier layer 200.

Figure 3:
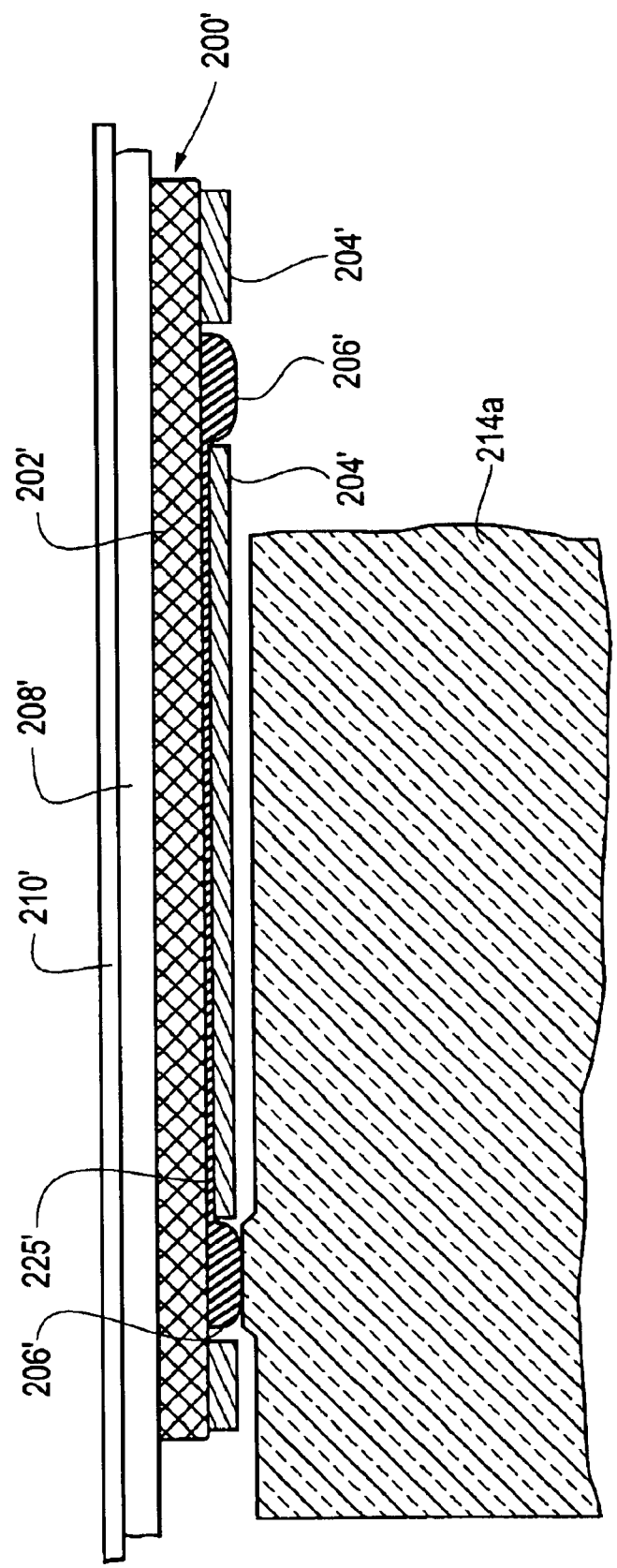
FIG. 3 is a cross-sectional view of the fuel cell assembly of FIG. 2, along line 3 of FIG. 2.

A cross-sectional view along line 3 of FIG. 2 is shown in FIG. 3. For a better understanding, FIG. 3 differs slightly from an exact cross-section along line 3. The distribution plate 214a' corresponds to the distribution plate 214a of FIG. 2. The resilient cushion 208' and the housing 210' correspond to the resilient cushion 108 and the housing 110 of FIG. 1. The electric contact in contacting device 200' comprises at least two parts, a contacting region 206' and a contacting path 225', a portion of the latter being superposed by insulating layer 204'. Where applicable, a plug or an on board circuit, like a semiconductor, is mounted in electrical contact with regions 206' and paths 225' of the contacting device 200' and disposed upon carrier layer 202'.

Figure 4:
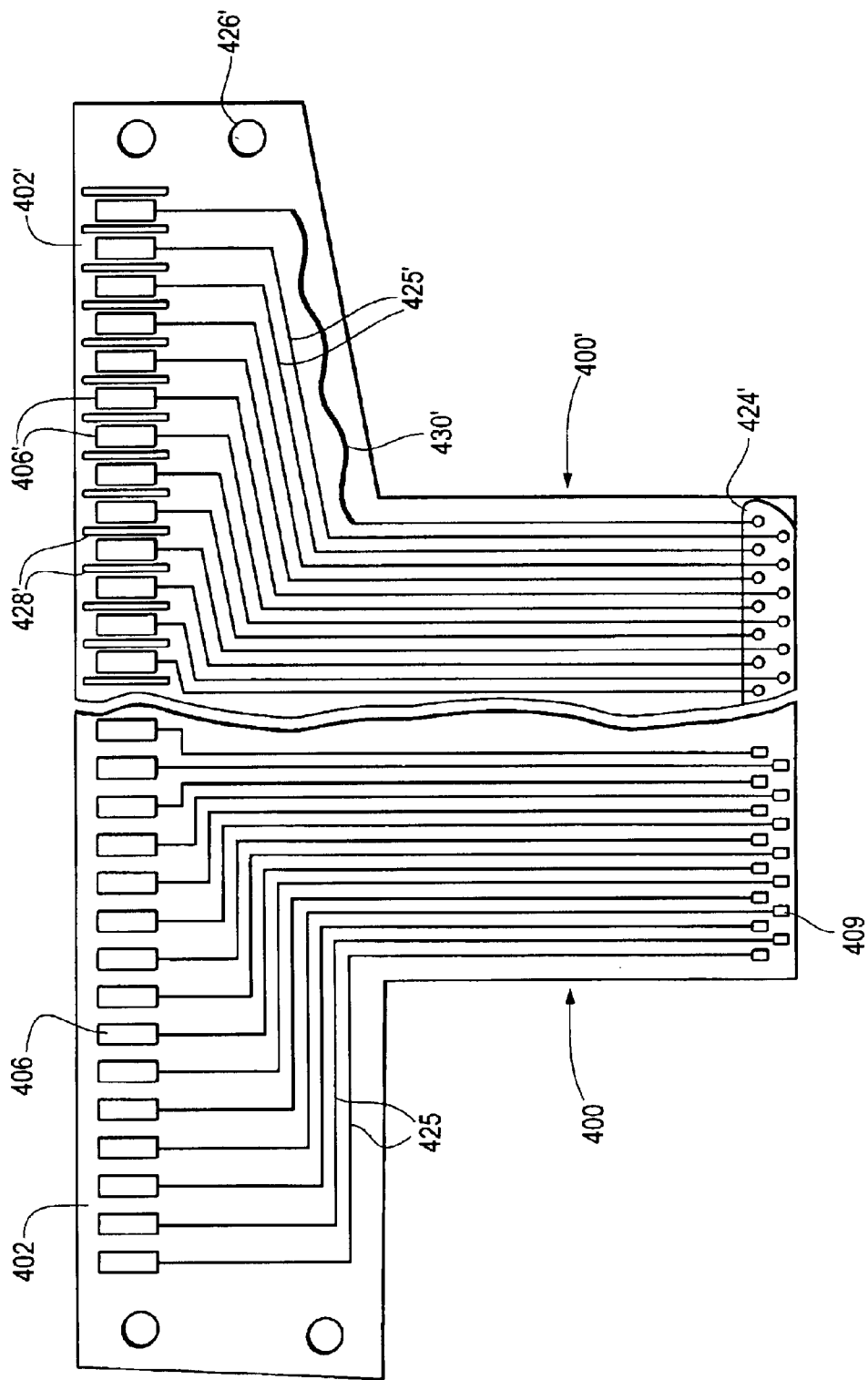
FIG. 4 is a schematic illustration of one face of an electrical contacting device with two different forms of electrical conduits.

FIG. 4 illustrates two embodiments of the active face of substantially planar electrical contacting devices 400, 400', with two possible arrangements of electrically conducting regions 406, 406' and paths 425, 425' on a carrier layer 402, 402' in plan view. Desirably, the electrical paths 425, 425' converge in a narrower section of the device which, in practice, is in an accessible, convenient location in the overall fuel cell assembly. The shape and pattern of electrical paths 425, 425' can be varied as desired. The contacting regions 406, 406' also can be of different forms and shapes. A path with meandering portion, such as illustrated at 430' may be incorporated to provide additional flexibility in path length in case the carrier layer and electric path 425' have different thermal expansion factors. In the event the flexibility of the printed circuit board has to be further increased, slots, openings or expansion cut-outs 428' between the electric conductive regions 406' can be formed in the carrier layer. The other end of the paths 425, 425' terminated with additional contacting regions 409 or with connectors or hooks 424', respectively, or with integrated circuits (not shown). The carrier material around the connectors can be reinforced by semi-flexible circuit boards. Optionally, openings 426' are provided for positioning the contacting device on the stack or sub-stack. The holes may, for example, engage with fasteners integrated in the stack end-plates or bus plates.

Figure 5:
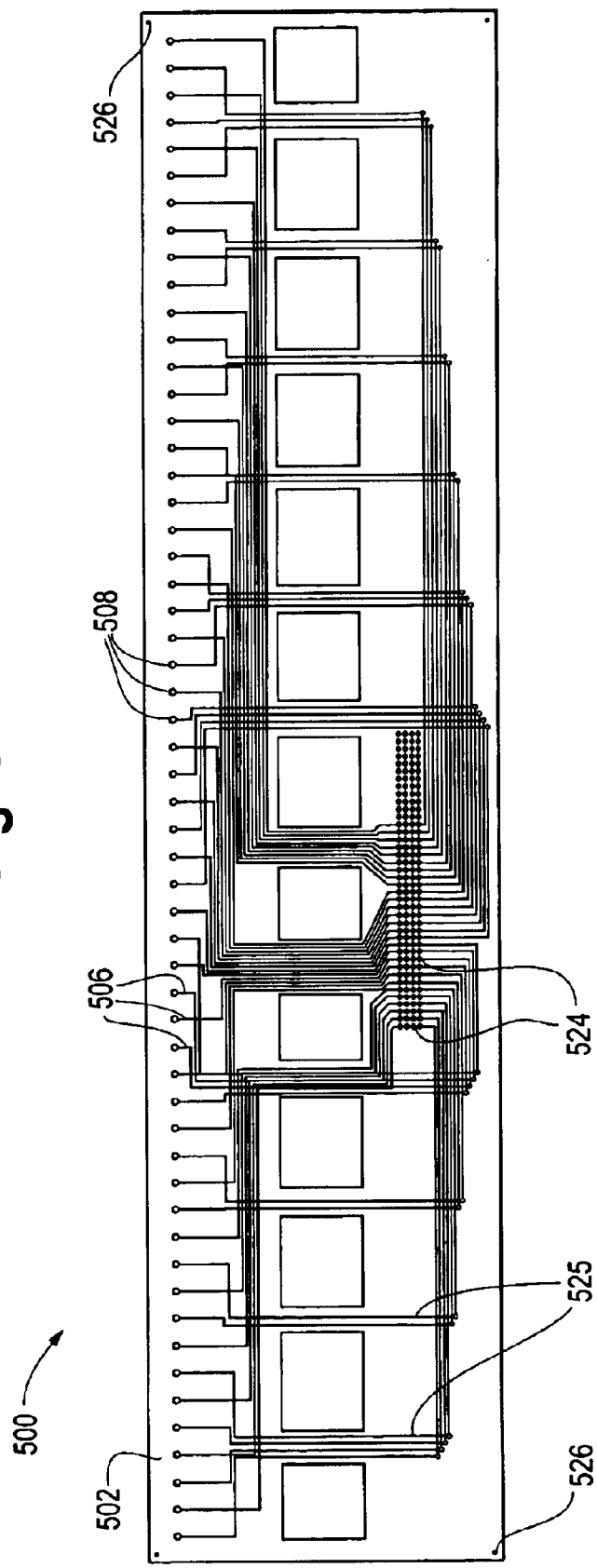
FIG. 5 is a plan view of one embodiment of a circuit board comprising a transparent carrier layer with electrical conduits provided on opposite planar surfaces of the carrier layer.

FIG. 5 illustrates in plan view an embodiment of a substantially planar circuit board 500. Circuit board 500 comprises two oppositely facing substantially planar surfaces with electrically conductive layers associated with each planar surface. To show the electrically conductive paths on both planar surfaces, carrier layer 502 is made transparent in FIG. 5. In the illustrated embodiment, a single electrically conductive path 525 connects each electrically conductive region 506 to a single hook or connector 524. Connectors 524 are arranged in close proximity to each other at a location where it is convenient to attach an electrical connector (not shown). The close proximity of connectors 524 reduces the requisite size of the electrical connector that attaches to connectors 524.

Figure 6:
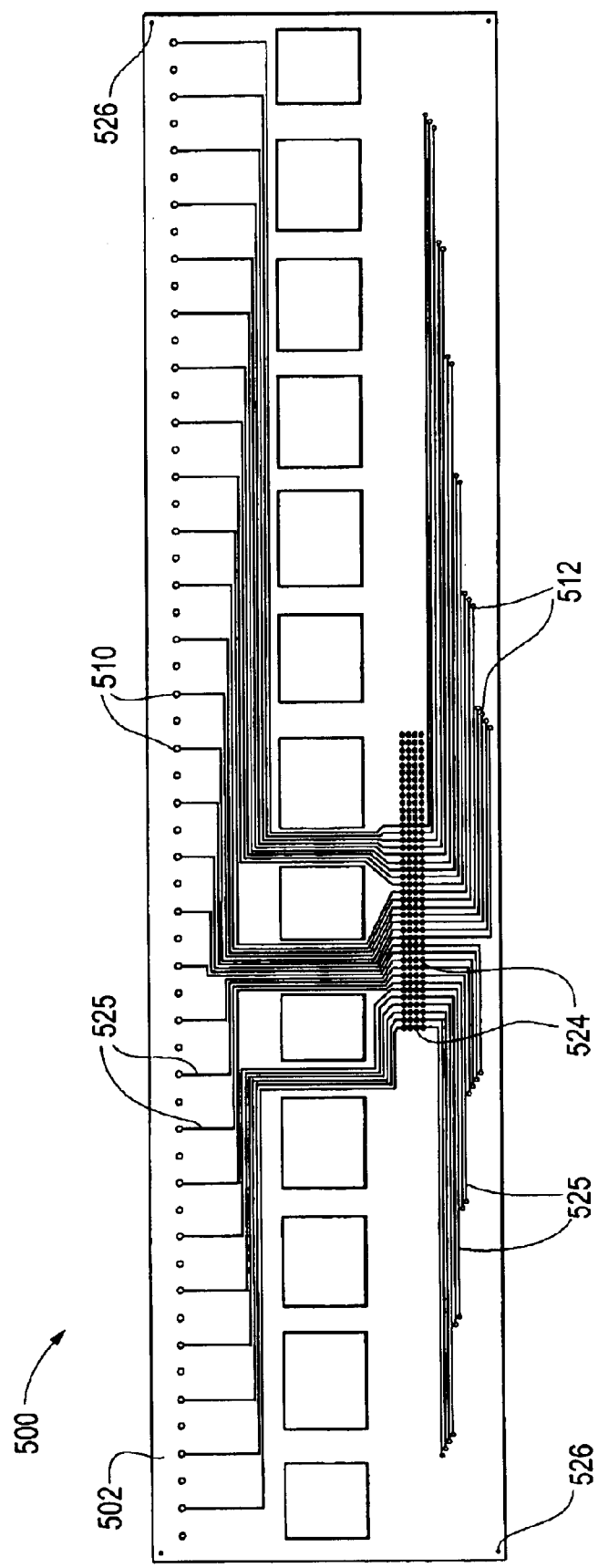

Transparent carrier layer 502 prevents electrical contact between electrical paths 525 that cross each other. In the illustrated embodiment, as shown in FIGS. 6 and 7, adjacent electrically conductive regions are connected to electrically conductive paths on opposite surfaces of carrier layer 502.

The electrically conductive regions further comprise electrically conductive pins or spikes 508 that assist in making contact with the fuel cell components. Fuel cell components such as, for example, separator plates may vary in thickness, within manufacturing tolerance limits. Pins 508 provide a connector between the electrical contacting device and the fuel cell stack that is more adaptable to accommodate such dimensional variability. Pins 508, when inserted into the fuel cell components, also ensure electrical contact and help to maintain an electrical connection when the assembly is subjected to vibrational loading or when there are differences between the relative degrees of expansion or contraction between the fuel cell stack and the circuit board.

The embodiment of FIG. 5 also comprises fastening points 526 for attaching the electrical contacting device to the fuel cell assembly. Fastening points 526 are holes for receiving fasteners. A resilient cushion, such as the one shown in FIG. 1 may be used in addition to the fasteners or in substitution therefor.

The electrical contacting device may be permanently connected to the fuel cell assembly, but preferably it is removably attached so that it can be removed for servicing the electrical contacting device or the fuel cell assembly. Alternatively, the removable electrical contacting device may be employed only as a diagnostic tool which is attached to the fuel cell assembly during servicing or periodic maintenance checks. Accordingly, removable fasteners are preferably employed, such as, for example, screws.

In the preferred embodiment of FIG. 5, the electrical contacting device further comprises a series of expansion cut-outs which improve the flexibility of carrier layer 502 and the electrical contacting device as a whole.

Another feature of the embodiment of FIG. 5 (and FIG. 4) is that electrically conductive regions 506 (406) are sufficiently spaced apart so as to not require insulating regions therebetween.

FIGS. 6 and 7 illustrate two different electrically conductive layers of the same electrical contacting device shown in FIG. 5 and like features are identified by like reference numerals.

FIG. 6 is the same plan view shown in FIG. 5, except that carrier layer 502 is shown opaque so that the electrically conductive layer on the opposing planar surface of carrier layer 502 is not visible in this view. The electrically conductive regions 506 (not shown in FIG. 6, but shown in FIGS. 5 and 7), are located on the opposite planar surface of carrier layer 502 and holes 510 in carrier layer 502 have an electrically conductive material disposed therein to form part of the continuous electrically conductive paths 525 from every other electrically conductive region 506 to a respective hook or connector 524. In this embodiment, each one of the electrical paths 525 ends at a connector 524 on the depicted side of carrier layer 502. Holes 512 which also have an electrically conductive material disposed therein form part of the continuous electrical path from the electrically conductive paths 525 which are partly disposed on the opposite planar surface (not shown in FIG. 6, but shown in FIGS. 5 and 7).

FIG. 7 shows only the conductive layer associated with the planar surface opposite to the surface shown in FIG. 6. The view in FIG. 7 is the plan view of the conductive layer as it would been seen if viewed through a transparent carrier layer so that the connections between the electrical paths on the opposite planar surfaces may be more easily recognized. Electrically conductive regions 506, pins 508, holes 512, connectors 524, and portions of electrically conductive paths 525 are shown in this view.

When a contacting device is being installed in a fuel cell assembly, the contacting device may be placed on a face of the fuel cell stack and secured using, for example, screws, bolts, nuts or compression devices. Instead of fasteners the contacting device may be fixed to the stack or engaged with it by means of surface elevations and depressions in the fuel cell stack and its plates. The stack with the contacting device in place may then be inserted in a housing if an additional cover around the stack is desired. Because the electrical contacting device can comprises a single piece, it can be easily positioned during manual or automatic assembly.

One material suitable for use in a flexible circuit board is a polyimide such as that known as FR produced by Ruwel-Werke, Germany. A circuit board of this kind may have a thickness of 0.25 mm with a conductive layer having a thickness of 0.04 mm. The conductive material is typically a nickel/gold alloy. However, the Brinell hardness is relatively high in comparison to other brands, and ranges between HB 70 and 100. Tests have shown that the thermal expansion factor (between $\alpha_1 = 1*10^{-5}/1°$ K and $7*10^{-5}/1°$ K) of the carrier material is similar to the thermal expansion factor $\alpha_2$ between $3*10^{-5}/1°$ K and $1*10^{-4}/1°$ K of a typical fuel stack comprising primarily graphite plates.

Another suitable material is a Kapton® polyimide-foil, which is commercially available from DuPont Electronics under the tradenames Pyralux® and Teclam®, which are flexible composites. This material may be preferred for certain applications. The film thickness of the carrier material ranges from 12.5 µm to 125 µm, and it has a copper layer of the same thickness. A thin adhesive layer binds these two layers. Tests have shown that the polyimide-foil material provides good dielectric strength of up to 150 kV/mm. The material is especially applicable for solid polymer fuel cells operating at higher than typical temperatures, for example, around 150° C. The material is resistant to the typical fluids used in automotive applications like gasoline, oil and transmission fluid. It may be advisable to cover the electrically conductive regions with another electrically conductive film to either lower the material resistance or to protect the regions against corrosion.

In operation, the contact regions of the contacting device should remain in reliable contact with the desired components of the fuel cell stack (usually the plates). Preferably, the contact regions have substantially similar thermal expansion factors as the stack (in the stacking direction). Additionally, formations on the edge face of the fuel cell stack may help in securing the contacts to the desired fuel cell components. A contacting device comprising a flexible board may be shaped in the exact form of the edge face of the fuel cell stack.

The contacting device can be used, for example, for monitoring operating parameters like current or voltage, for short circuiting or by-passing individual cells or for directing signals to the stack or modulating operation of the cells.

While particular elements, embodiments and applications of the present invention have been shown and described, it will be understood, of course, that the invention is not limited thereto since modifications may be made by those skilled in the art without departing from the spirit and scope of the present disclosure, particularly in light of the foregoing teachings.

What is claimed is:

1. A fuel cell assembly comprising
   a fuel cell stack comprising membrane electrode assemblies interposed between separator plates; and
   an electrical contacting device mounted on a face of said stack, said device comprising a circuit board with electrically conductive regions that are in electrical contact with fuel cell components of said fuel cell stack.

2. The fuel cell assembly of claim 1 wherein said circuit board is a flexible printed circuit board.

3. The fuel cell assembly of claim 1 wherein said circuit board is fastened to said stack by fasteners.

4. The fuel cell assembly of claim 1 further comprising a compression device for urging said circuit board against said face of said stack.

5. The fuel cell assembly of claim 1 wherein said circuit board is in interlocking engagement with said stack.

6. The fuel cell assembly of claim 1 wherein said electrical contacting device is removably attached to said stack.

7. The fuel cell assembly of claim 1 wherein said electrically conductive regions are in electrical contact with at least some of said separator plates.

8. The fuel cell assembly of claim 1 wherein said circuit board comprises at least two layers.

9. The fuel cell assembly of claim 8 wherein one of said at least two layers is an electrically insulating carrier layer upon which one or more other layers are disposed.

10. The fuel cell assembly of claim 8 wherein one of said at least two layers comprises said electrically conductive regions and electrically conductive paths, and wherein at least one of said regions is electrically connected to at least one of said paths.

11. The fuel cell assembly of claim 8 wherein one of said at least two layers is an electromagnetic shielding layer.

12. The fuel cell assembly of claim 1 wherein said circuit board comprises a carrier layer and electrically conductive layers associated with opposite surfaces of said carrier layer, wherein each one of said electrically conductive layers comprises at least one electrically conductive path connected to one of said electrically conductive regions.

13. The fuel cell assembly of claim 1 wherein said electrically conductive regions are covered by an electrically conductive film having a material resistance that is lower than the material resistance of said regions, and wherein said film is corrosion resistant.

14. A fuel cell assembly comprising
   a fuel cell stack comprising membrane electrode assemblies interposed between separator plates; and
   an electrical contacting device mounted on a face of said stack, said device comprising a printed circuit board with electrically conductive regions that are in electrical contact with fuel cell components of said fuel cell stack;
   wherein the thermal expansion factors of said printed circuit board and said fuel cell stack are within about a factor of 10 of each other.

15. The fuel cell assembly of claim 14 wherein said printed circuit board is a flexible printed circuit board.

16. The fuel cell assembly of claim 15 wherein said thermal expansion factors of said flexible printed circuit board and said fuel cell stack are within about a factor of 3 of each other.

17. The fuel cell assembly of claim 15 wherein said thermal expansion factor of said flexible printed circuit board is between about $1*10^{-5}/1°$ and about $7*10^{-5}/1°$ K and said thermal expansion factor of said fuel cell stack is between about $3*10^{-5}/1°$ K and about $1*10^{-4}/1°$ K.

18. The fuel cell assembly of claim 15 wherein said thermal expansion factors of said flexible printed circuit board and said fuel cell stack are substantially identical.

19. The fuel cell assembly of claim 15 wherein said flexible printed circuit board comprises polyimide.

20. The fuel cell assembly of claim 15 wherein said separator plates are composed primarily of graphite.

21. The fuel cell assembly of claim 15 wherein said electrically conductive regions are in electrical contact with at least some of said separator plates.

* * * * *